(12) United States Patent
Butler et al.

(10) Patent No.: US 10,503,086 B2
(45) Date of Patent: Dec. 10, 2019

(54) LITHOGRAPHIC APPARATUS AND DEVICE MANUFACTURING METHOD

(71) Applicant: ASML NETHERLANDS B.V., Veldhoven (NL)

(72) Inventors: Hans Butler, Best (NL); Cornelius Adrianus Lambertus De Hoon, Eindhoven (NL); Fransiscus Mathijs Jacobs, Asten (NL); Pavel Kagan, Eindhoven (NL); Jeroen Pieter Starreveld, Eindhoven (NL); Maurice Willem Jozef Etiënne Wijckmans, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 16/068,211

(22) PCT Filed: Dec. 7, 2016

(86) PCT No.: PCT/EP2016/080062
§ 371 (c)(1),
(2) Date: Jul. 6, 2018

(87) PCT Pub. No.: WO2017/118508
PCT Pub. Date: Jul. 13, 2017

(65) Prior Publication Data
US 2019/0011838 A1    Jan. 10, 2019

(30) Foreign Application Priority Data

Jan. 7, 2016 (EP) .................................... 16150424

(51) Int. Cl.
*G03F 7/20* (2006.01)

(52) U.S. Cl.
CPC .......... *G03F 7/709* (2013.01); *G03F 7/70833* (2013.01); *G03F 7/70866* (2013.01)

(58) Field of Classification Search
CPC ............. G03F 7/70833; G03F 7/70775; G03F 7/70866

(Continued)

(56) References Cited

U.S. PATENT DOCUMENTS

2004/0137384 A1* 7/2004 Hara ................... G03F 7/70833
430/434
2006/0077368 A1* 4/2006 Iwata .................. G03F 7/70833
355/53

(Continued)

FOREIGN PATENT DOCUMENTS

JP    2001091681 A    4/2001
JP    2004221251 A    8/2004

(Continued)

OTHER PUBLICATIONS

Office Action issued in Japanese Patent Application No. 2018-533777 dated Jun. 4, 2019, 16 pages (with English-language translation).

*Primary Examiner* — Hung Nguyen
(74) *Attorney, Agent, or Firm* — Arent Fox LLP (57) ABSTRACT

A lithographic apparatus is described, the lithographic apparatus comprising:
an illumination system configured to condition a radiation beam;
a support constructed to support a patterning device, the patterning device being capable of imparting the radiation beam with a pattern in its cross-section to form a patterned radiation beam;
a projection system configured to project the patterned radiation beam onto a target portion of a substrate,
a stage assembly comprising:

(Continued)

a substrate table constructed to hold the substrate; and a positioning device configured to displace the substrate table relative to the projection system;

a base frame onto which stage assembly and the projection system are mounted;

the base frame comprising a first portion configured to support the stage assembly and a second portion configured to support the projection system, the first portion and the second portion being connected to each other via a compliant portion of the base frame.

15 Claims, 5 Drawing Sheets

(58) Field of Classification Search
USPC .................................................. 355/53, 75
See application file for complete search history.

(56) References Cited

U.S. PATENT DOCUMENTS

| | | | |
|---|---|---|---|
| 2006/0279716 | A1 | 12/2006 | Cox |
| 2012/0056105 | A1* | 3/2012 | Aoki ................ F16C 29/025 |
| | | | 250/491.1 |
| 2015/0346611 | A1* | 12/2015 | Noda ................ G03F 7/70775 |
| | | | 355/75 |

FOREIGN PATENT DOCUMENTS

| | | |
|---|---|---|
| JP | 2004-273491 A | 9/2004 |
| JP | 2005183710 A | 7/2005 |
| JP | 2006344969 A | 12/2006 |
| JP | 2012060117 A | 3/2012 |
| JP | 2012097786 A | 5/2012 |
| JP | 2014086524 A | 5/2014 |
| WO | 2013-034753 A1 | 3/2013 |

* cited by examiner

LITHOGRAPHIC APPARATUS AND DEVICE MANUFACTURING METHOD

CROSS-REFERENCE TO RELATED APPLICATIONS

This application is the U.S. National Stage Application of International Patent Application No. PCT/EP2016/080062, filed on Dec. 7, 2016 which claims priority of EP application 16150424.6 which was filed on Jan. 7, 2016 both of which are incorporated herein in their entirety by reference.

BACKGROUND

Field of the Invention

The present invention relates to a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure that the pattern is appropriately projected onto the target portion, it is important to ensure that the target portion is accurately positioned relative to the patterned radiation beam. As such, considerable effort is spent in ensuring that the position of the patterned radiation beam does not displace due to vibrations. Typically, a lithographic apparatus comprises a base frame onto which a stage apparatus for moving the substrate relative to the projection system and a projection system are mounted. In order to isolate vibrations due to movements of the stage apparatus from propagating to the projection system, the projection system of a lithographic apparatus may e.g. be mounted to a separate frame that is supported by the base frame of the apparatus by means of a plurality of vibration isolators. As accuracy requirements become more stringent, such an arrangement may however not be sufficient to isolate the projection system.

SUMMARY

It is desirable to improve the vibrational isolation of a projection system of a lithographic apparatus. In order to realize this, there is provided, according to an embodiment of the invention, a lithographic apparatus comprising:
an illumination system configured to condition a radiation beam;
a support constructed to support a patterning device, the patterning device being capable of imparting the radiation beam with a pattern in its cross-section to form a patterned radiation beam;
a projection system configured to project the patterned radiation beam onto a target portion of a substrate,
a stage assembly comprising:
 a substrate table constructed to hold the substrate; and
 a positioning device configured to displace the substrate table relative to the projection system;
a base frame onto which stage assembly and the projection system are mounted;
the base frame comprising a first portion configured to support the stage assembly and a second portion configured to support the projection system, the first portion and the second portion being connected to each other via a compliant portion of the base frame.

In another embodiment of the invention, there is provided a lithographic apparatus comprising:
an illumination system configured to condition a radiation beam;
a support constructed to support a patterning device, the patterning device being capable of imparting the radiation beam with a pattern in its cross-section to form a patterned radiation beam;
a projection system configured to project the patterned radiation beam onto a target portion of a substrate,
a stage assembly comprising:
 a substrate table constructed to hold the substrate; and
 a positioning device configured to displace the substrate table relative to the projection system;
a base frame onto which stage assembly and the projection system are mounted;
the base frame comprising a first portion configured to support the stage assembly and a second portion configured to support the projection system; the base frame further comprising a deformable seal arranged to bridge a gap between the first portion and the second portion.

According to an embodiment of the invention, there is provided a device manufacturing method comprising projecting a patterned beam of radiation onto a substrate, using a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
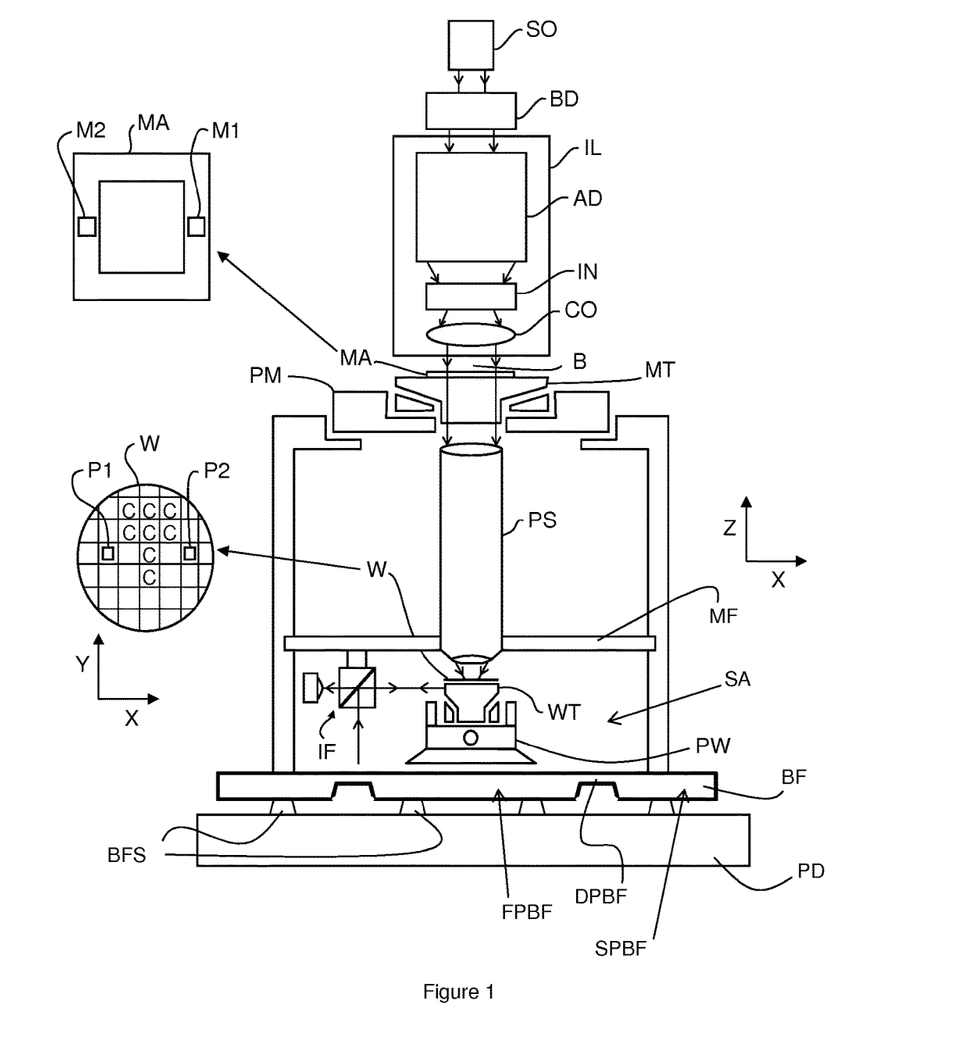
FIG. 1 depicts a lithographic apparatus according to a first embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. In accordance with the present invention, the substrate W may be displaced relative to the projection system PS by means of a stage assembly SA, the stage assembly SA comprising a substrate table WT, which is constructed to hold the substrate W; and the positioning device PW that is configured to displace the substrate table WT relative to the projection system PS.

With the aid of the positioning device PW and a position sensor IF (e.g. an interferometric device, linear encoder or capacitive sensor), the substrate table WT can be moved accurately, e.g. so as to position different target portions C in the path of the radiation beam B. Similarly, the positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which may form part of the positioning device PM. Similarly, movement of the substrate table WT or "substrate support" may be realized using a long-stroke module and a short-stroke module, which form part, in an embodiment of the present invention, of the positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In accordance with the present invention, the lithographic apparatus further comprises a base frame BF onto which the stage assembly SA and the projection system PS are mounted. In the embodiment as shown, the projection system PS is mounted to a so-called metrology frame MF, which may be mounted onto the base frame BF by means of vibration isolators such as air mounts or the like. In the embodiment as shown, the base frame BF is mounted to a pedestal PD by means of base frame supports BFS. As an alternative, the base frame BF may also be mounted onto a ground floor or factory floor. Further, in accordance with an embodiment of the present invention, the base frame BF a first portion FPBF configured to support the stage assembly SA and a second portion SPBF configured to support the projection system PS, the first portion and the second portion being connected to each other via a compliant portion DPBF of the base frame BF. As will be explained in more detail below, the compliant portion DPBF enables to provide in an improved isolation of the projection system PS from vibrations that are caused by displacements of the stage assembly relative to the base frame BF. Within the meaning of the present invention, a compliant portion or compliant seal refers to a portion or seal that is flexible or deformable in at least one degree of freedom.

In a lithographic apparatus, a substrate stage WT is displaced relative to projection system PS in order to project a pattern onto each target portion C on the substrate W. Due to said displacement, the stage assembly SA may exert a force and/or torque on the base frame BF supporting the stage assembly SA. Resulting vibrations could, in case no measures are taken, propagate towards the projection system PS, even when the projection system PS is mounted to the base frame BF via vibration isolators. In order to mitigate this effect, the base frame BF according to an embodiment of the present invention, comprises a compliant, i.e. a deformable or flexible portion DPBF arranged between the first portion and the second portion. By including such a compliant portion, the propagation of vibrations, in particular vertical and rotational displacements of the base frame portion FPBF supporting the stage assembly SA, can be mitigated. By introducing the deformable or compliant portion DPBF, the base frame BF may in fact behave as two base frames that are dynamically isolated, at least for vibrations in a certain frequency range. This principle is schematically illustrated in FIGS. 2a and 2b.

Figure 2A:
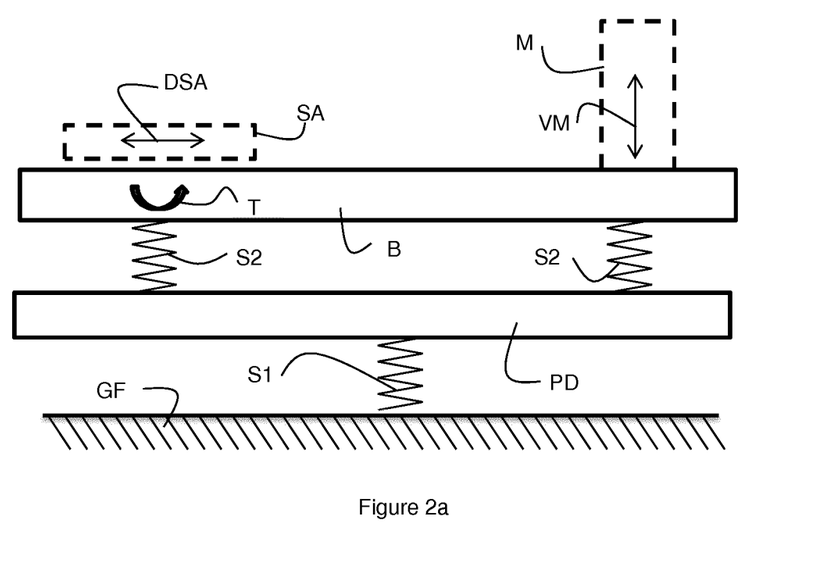
FIGS. 2a and 2b depict the effect of having a dynamic decoupling by applying a base frame according to the present invention.

FIG. 2a schematically depicts a base frame B mounted to a pedestal PD in a conventional manner. As shown, the pedestal PD is mounted to a ground floor GF by a comparatively stiff support S1. The base frame B is mounted to the pedestal PD by means of the support S2, which may also be a comparatively stiff support, e.g. having a stiffness of 1e8 N/m. in case a torque T is applied to the base frame B, e.g. due to a displacement DSA of a stage assembly SA or a part thereof, a vertical movement VM of the base frame B may occur. Said vertical movement VM may e.g. adversely affect any object or system M, e.g. a projection system or a metrology frame, that is mounted on the base frame B adjacent the stage assembly SA.

Figure 2B:
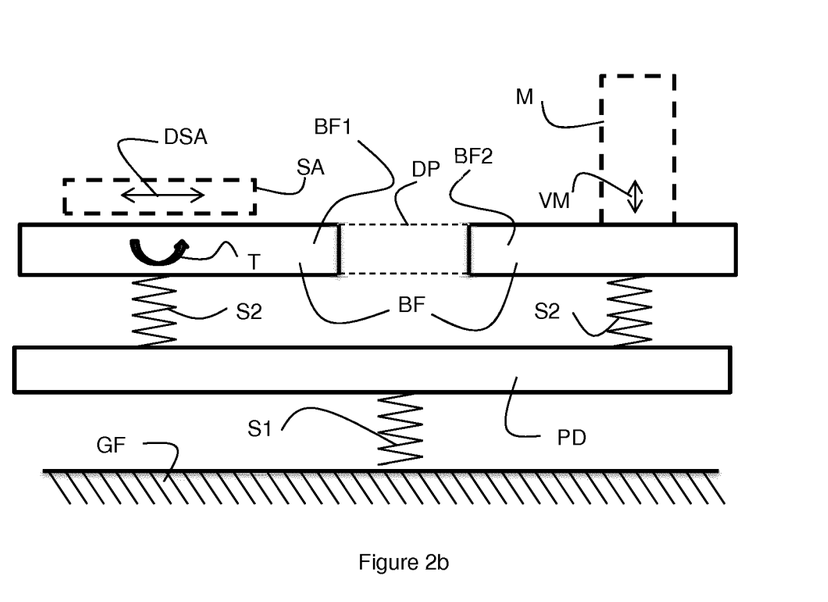

By applying a base frame BF in accordance with an embodiment of the present invention, as illustrated in FIG. 2b, a displacement DSA of a stage assembly may have far less effect on a object or system M that is mounted adjacent the stage assembly. By providing a compliant portion (indicated by the dotted lines DP) between a first portion BF1 of the base frame BF and a second portion BF2 of the base frame BF, the effects of a torque T acting on the base frame portion BF1 onto which the stage assembly SA (e.g. a substrate table and a positioning device) is mounted will propagate much more difficult. Due to the compliant portion DP, vibrations basically need to propagate via the pedestal PD which, in general, will have a comparatively high mass. The same holds when the base frame BF would be mounted to a ground floor or a factory floor. As a result, the second portion BF2 will be less affected by stage assembly induced torques.

The base frame concept as illustrated in FIGS. 1 and 2b, may also be applied in a lithographic apparatus that applies EUV radiation, i.e. whereby the exposure process takes place under vacuum conditions.

Figure 3:
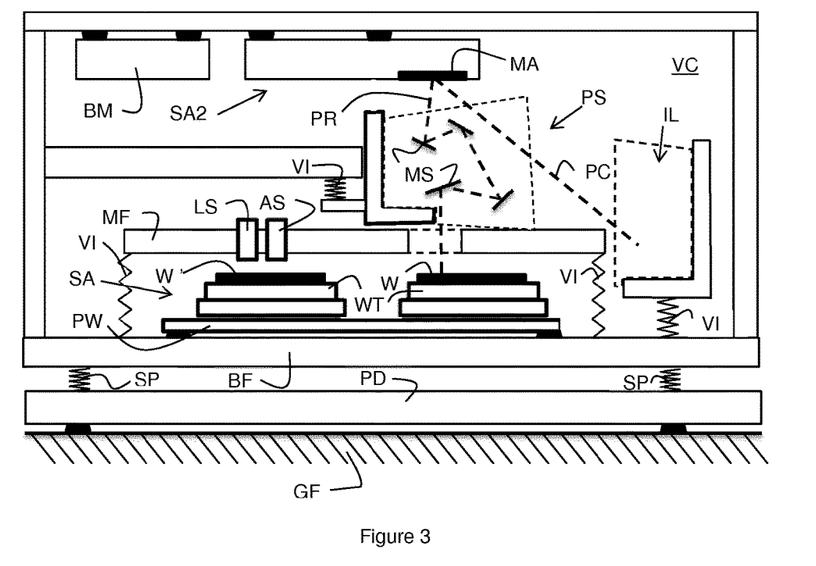
FIGS. 3 and 4 depict a lithographic apparatus as known in the art.
Figure 4:
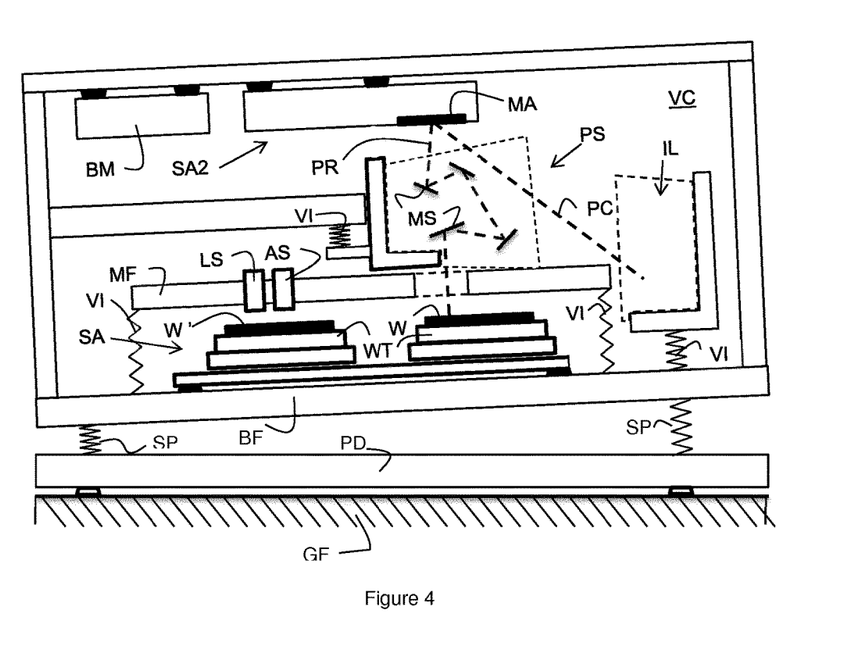

FIGS. 3 and 4 schematically illustrate a possible lay-out of such a lithographic apparatus as known in the art. FIG. 3 schematically shows a cross-sectional view of an EUV-type lithographic apparatus including an illumination system IL and a projection system PS, the projection system PS comprising a plurality of mirrors MS configured to redirect a patterned beam PR of radiation onto a substrate W that is mounted on a substrate table WT. In the arrangement as shown, the substrate table WT forms part of a dual stage assembly SA that includes two substrate tables WT that can be displaced by a positioning device PW, e.g. a planar motor assembly or a linear motor assembly. In the arrangement as shown, the illumination system IL projects a conditioned beam PC of radiation onto a patterning device MA (in this case a reflective patterning device) to generate the patterned beam of radiation PR. The patterning device MA is mounted to a second stage assembly SA2, e.g. including an object table to hold the patterning device MA and a positioning device for positioning the patterning device MA. The stage assembly may e.g. include a balance mass BM onto which reaction forces can be exerted. The arrangement as shown further comprises a vibrationally isolated frame, e.g. a metrology frame MF, onto which position measurement devices may be mounted or measurement devices to characterize a substrate prior to exposure, such measurement devices e.g. including a level sensor LS for determining a height map of a substrate W' and an alignment sensor AS for determining a position of alignment marks on the substrate W'. In the arrangement as shown, the stage assemblies, the illumination system IL, the metrology frame and the projection system PS are all mounted (either directly or via vibration isolators VI) to a common base frame BF, the base frame BF forming a bottom of a vacuum chamber VC enclosing the stage assemblies, the illumination system IL, the metrology frame and the projection system PS. In the arrangement as shown, the base frame BF is mounted to a pedestal PD via comparatively stiff supports SP, the pedestal PD being mounted on a ground floor GF. When one of the substrate tables WT of the stage assembly SA is displaced in a horizontal plane, a similar problem as illustrated in FIG. 2a may occur, as shown in FIG. 4. A torque exerted on the base frame BF may cause a tilt or rotation of the base frame BF, primarily because the base frame BF is connected to the pedestal PD with a limited stiffness, i.e. the stiffness is not infinitely large. The resulting rotation may result in displacements of the positions of the vibration isolators, such as vibration isolators VI, which may propagate to the metrology frame MF, thus generating a metrology frame acceleration. As a result, projection of the patterned radiation beam PR onto the substrate W may become less accurate, causing an overlay error in response.

In order to avoid or mitigate this issue, the present invention proposes to at least partially dynamically decouple the base frame portion onto which the stage assembly is mounted from a base frame portion onto which other assemblies such as the projection system PS or the illumination system IL are mounted. Such an arrangement is schematically shown in FIG. 5.

Figure 5:
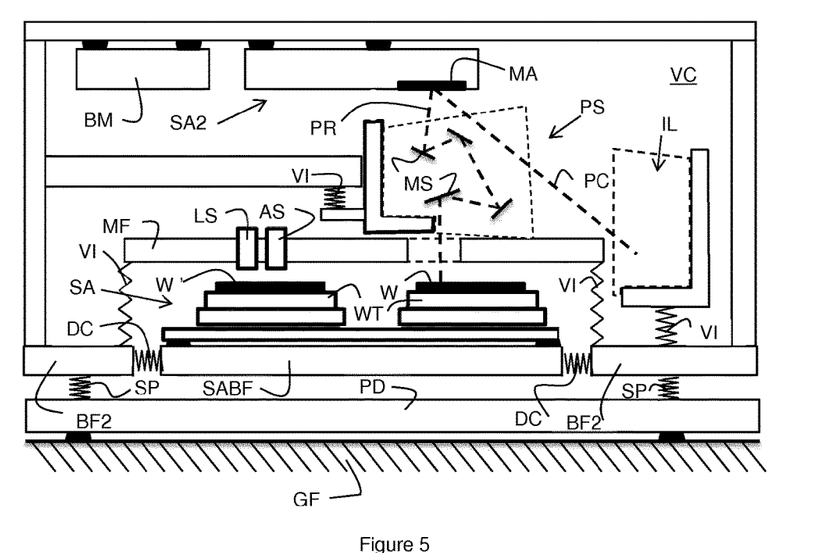
FIG. 5 schematically depicts a lithographic apparatus according to a second embodiment of the present invention.

FIG. 5 schematically shows a cross-sectional view of a lithographic apparatus according to an embodiment of the present invention. In the embodiment of FIG. 5, the stage assembly SA is supported by a first portion SABF of a base frame, whereas the illumination system IL, the projection system PS and the metrology frame MF are supported by a second portion BF2 of the base frame. In the embodiment as shown, a coupling DC is provided connecting the first portion SABF of the base frame to the second portion BF2 of the base frame. In accordance with the present invention, the coupling DC may be realized in various ways.

In an embodiment, the coupling DC comprises a deformable seal sealing a gap between the first base frame portion SABF and the second base frame portion BF2. In case of the application of the base frame in an EUV-type lithographic apparatus, the gap between the first base frame portion SABF and the second base frame portion BF2 should be sealed in order to maintain the vacuum inside the vacuum chamber VC. With respect to the compliance, i.e. deformability or flexibility of the seal, it can be pointed out that a compliance is primarily required in the vertical direction, in order to mitigate the effect of the rotation or tilt as shown in FIG. 4. As such, the compliant or deformable seal may e.g. comprise a leaf spring arranged to deform in the vertical direction, while having a comparatively large stiffness in the horizontal direction. As an alternative to the use of a leaf spring or leaf springs, a bellow may be applied as well to bridge a gap between the first base frame portion SABF and the second base frame portion BF2.

In an embodiment, the first portion and the second portion of the base frame are connected to each other via a compliant portion of the base frame itself. In such embodiment, the base frame does not consist of discrete component that are connected, rather, the first portion of the base frame, the second portion of the base frame and the compliant portion of the base frame may form one body. Such an arrangement is e.g. schematically shown in FIG. 1. In such embodiment, the upper surface of the base frame may be a continuous surface.

Figure 6:
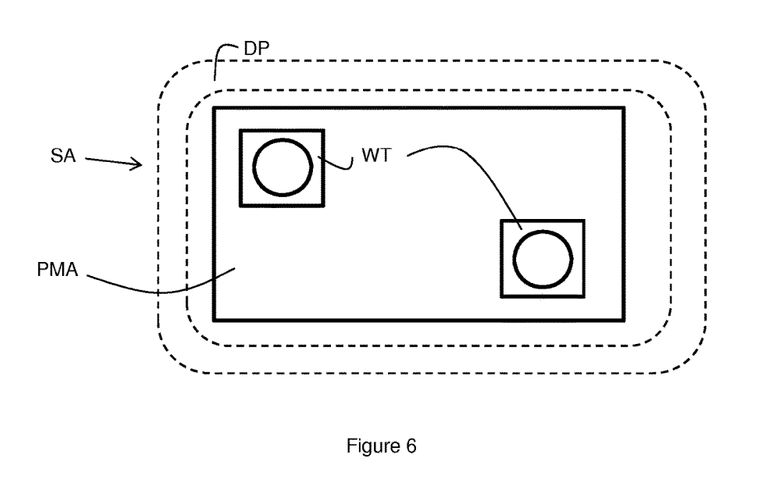
FIG. 6 schematically depicts a top view of a stage assembly as can be applied in a lithographic apparatus according to the present invention.

In an embodiment, the compliant portion of the base frame may circumscribe an operating area of the stage assembly. FIG. 6 schematically shows a top view of a stage assembly as can be applied in a lithographic apparatus according to the present invention, to illustrate this.

FIG. 6 schematically shows a top view of a stage assembly SA comprising a planar motor arrangement including a two-dimensional array of permanent magnets PMA and two substrate tables WT which can be displaced relative to the permanent magnet array PMA by energizing coil assemblies onto which the substrate tables WT are mounted. In an alternative arrangement, PMA may be configured as a two-dimensional coil array configured to co-operate with permanent magnet arrays on to which the substrate tables WT are mounted. FIG. 6 further schematically shows a contour DP indicating the location of the compliant portion of the base frame onto which the stage assembly SA is mounted. In an embodiment, as also schematically shown in FIG. 1, the compliant portion of the base frame can be realized by providing this portion with a smaller thickness than the first portion of the base frame, i.e. the portion supporting the stage assembly.

In an embodiment, the compliant portion is configured to enable a displacement of the first portion relative to the second portion in a vertical direction or about an horizontal axis.

In order to mitigate the adverse effect as illustrated in FIG. 4, one may e.g. consider designing the compliant portion or the deformable seal with a stiffness in the vertical direction that is an order of magnitude smaller than the vertical stiffness of the supports supporting the base frame, e.g. supports SP as shown in FIG. 5.

In an embodiment of the present invention, the adverse effect as illustrated in FIG. 4 is even further reduced, by subdividing a pedestal onto which the base frame is mounted into two portions, whereby the first portion of the base frame is mounted to a first portion of the pedestal and the second portion of the base frame is mounted to a second portion of the pedestal. In such embodiment, the first and second portion of the pedestal may e.g. be dynamically decoupled or partially decoupled.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting a pattern to a cross section of the radiation beam to form a patterned radiation beam;
   a projection system configured to project the patterned radiation beam onto a target portion of a substrate,
   a stage assembly comprising:
      a substrate table constructed to hold the substrate; and
      a positioning device configured to displace the substrate table relative to the projection system;
   a base frame onto which the stage assembly and the projection system are mounted;
   the base frame comprising a first portion configured to support the stage assembly and a second portion configured to support the projection system, the first portion and the second portion being connected to each other via a compliant portion of the base frame, the compliant portion being configured to enable a displacement of the first portion relative to the second portion in a vertical direction or about a horizontal axis.

2. The lithographic apparatus according to claim 1, wherein the compliant portion circumscribes an operating area of the stage assembly.

3. The lithographic apparatus according to claim 1, wherein the compliant portion of the base frame has a smaller thickness than the first portion.

4. The lithographic apparatus according to claim 1, wherein the first portion, the second portion and the compliant portion constitute a single body.

5. The lithographic apparatus according to claim 1, wherein the base frame constitutes a bottom portion of a vacuum chamber enclosing the projection system.

6. The lithographic apparatus according to claim 5, wherein the vacuum chamber further encloses the illumination system and the stage assembly.

7. The lithographic apparatus according to claim 1, wherein the projection system is mounted to the second portion of the base frame via at least one vibration isolator.

8. The lithographic apparatus according to claim 7, wherein the at least one vibration isolator comprises one of a sealed pneumatic isolator and a leaf spring.

9. A method of manufacturing a device, the method comprising the steps of:
   providing a base frame onto which a stage assembly and a projection system are mounted, the base frame comprising a first portion configured to support the stage assembly and a second portion configured to support the projection system, the first portion and the second portion being connected to each other via a compliant portion of the base frame, the compliant portion being configured to enable a displacement of the first portion relative to the second portion in a vertical direction or about a horizontal axis, the projection system being configured to project a patterned radiation beam onto a target portion of a substrate and the a stage assembly comprising a substrate table constructed to hold the substrate and a positioning device configured to displace the substrate table relative to the projection system;

placing the substrate on the substrate table;

displacing the substrate table with the substrate to a position where the projection system is capable of illuminating the substrate; and projecting the patterned radiation beam onto a target portion of the substrate.

10. The lithographic apparatus according to claim 2, wherein the compliant portion of the base frame has a smaller thickness than the first portion.

11. The lithographic apparatus according to claim 2, wherein the first portion, the second portion and the compliant portion constitute a single body.

12. The lithographic apparatus according to claim 6, wherein the base frame constitutes a bottom portion of a vacuum chamber enclosing the projection system.

13. The lithographic apparatus according to claim 12, wherein the vacuum chamber further encloses the illumination system and the stage assembly.

14. A lithographic apparatus comprising:

an illumination system configured to condition a radiation beam;

a support constructed to support a patterning device, the patterning device being capable of imparting a pattern to a cross section of the radiation beam to form a patterned radiation beam;

a projection system configured to project the patterned radiation beam onto a target portion of a substrate, a stage assembly comprising:
  a substrate table constructed to hold the substrate; and
  a positioning device configured to displace the substrate table relative to the projection system;

a base frame onto which the stage assembly and the projection system are mounted;

the base frame comprising a first portion configured to support the stage assembly and a second portion configured to support the projection system, the first portion and the second portion being connected to each other via a compliant portion of the base frame, the illumination system being mounted to the second portion of the base frame.

15. A lithographic apparatus comprising:

an illumination system configured to condition a radiation beam;

a support constructed to support a patterning device, the patterning device being capable of imparting a pattern to a cross section of the radiation beam to form a patterned radiation beam;

a projection system configured to project the patterned radiation beam onto a target portion of a substrate, a stage assembly comprising:
  a substrate table constructed to hold the substrate; and
  a positioning device configured to displace the substrate table relative to the projection system;

a base frame onto which the stage assembly and the projection system are mounted;

the base frame comprising a first portion configured to support the stage assembly and a second portion configured to support the projection system, the first portion and the second portion being connected to each other via a compliant portion of the base frame, the base frame being mounted to a pedestal with the first portion of the base frame being mounted to a first portion of the pedestal and the second portion of the base frame being mounted to a second portion of the pedestal.

* * * * *